United States Patent

Kato et al.

[11] 3,931,582
[45] Jan. 6, 1976

[54] ISOLATED DC AMPLIFIER CIRCUIT

[75] Inventors: Kazuo Kato, Tohkai; Yasuji Kamata, Hitachi, both of Japan

[73] Assignee: Hitachi, Ltd., Japan

[22] Filed: Aug. 22, 1974

[21] Appl. No.: 499,794

[30] Foreign Application Priority Data
Aug. 22, 1973 Japan.............................. 48-93336

[52] U.S. Cl. ...................... 330/10; 330/25; 330/97
[51] Int. Cl.² ............................................. H03F 3/38
[58] Field of Search .................. 330/9, 10, 25, 97

[56] References Cited
UNITED STATES PATENTS

| | | | |
|---|---|---|---|
| 3,193,773 | 7/1965 | Oglum et al. ........................ | 330/10 |
| 3,825,846 | 7/1974 | Grygera ........................... | 330/10 X |
| 3,835,408 | 9/1974 | Shaffer............................. | 330/10 |

*Primary Examiner*—James B. Mullins
*Attorney, Agent, or Firm*—Craig & Antonelli

[57] ABSTRACT

A DC amplifier circuit with transformer coupled isolation comprises a DC amplifier, an electronic switching element connected to the output terminal of the DC amplifier, a pulse generator for driving the electronic switching element, a small pulse transformer having a primary winding and secondary winding. To the primary winding of the small transformer pulsating signals from the electronic switching element are applied, and two substantially identical circuits each having a diode and a condenser in series are connected respectively across the primary winding and the secondary winding of the small pulse transformer. Means for feeding back the smoothed signals from the circuit across the primary winding of the small pulse transformer is connected to a negative input terminal of the DC amplifier.

6 Claims, 8 Drawing Figures

ISOLATED DC AMPLIFIER CIRCUIT

BACKGROUND OF THE INVENTION

The present invention relates to an isolated DC amplifier circuit and, in particular, to a DC amplifier circuit with transformer coupled isolation, which is employed for transmitting DC signals from the input side to the output side of a circuit whose potentials with respect to ground differ from each other.

For the above purpose, a magnetic operational amplifier circuit, a modulation type DC amplifier circuit with modulation feedback, and a pulse width transmission type DC amplifier circuit have been employed. However, these circuits are complex, large in size and power consumption, and slow in operating speed. Further, these circuits are significantly influenced by noise because of a large stray capacitance caused by numerous insulating portions and the large size of the circuit. Still further, these circuits cannot be used in severe conditions, because of a great many circuit elements, some of which have their operating characteristics changed by ambient conditions.

SUMMARY OF THE INVENTION

One object of the present invention is to provide an isolated DC amplifier circuit, in which sag and incomplete back swing of DC pulse transmitted through a pulse transformer of the circuit cannot damage the precision of the circuit.

Another object of the present invention is to provide an isolated DC amplifier circuit having a high operational speed.

A further object of the present invention is to provide an isolated DC amplifier circuit which is hardly affected by variations in the duty ratio of the waveform of driving signals.

Still a further object of the present invention is to provide an isolated DC amplifier circuit employing an extremely small pulse transformer as its circuit element.

Still a further object of the present invention is to provide an isolated DC amplifier circuit little influenced by noise.

Still another object of the present invention is to provide a simple isolated DC amplifier circuit.

Yet a further object of the present invention is to provide an isolated DC amplifier circuit with a limited power consumption.

An additional object of the present invention is to provide an isolated DC amplifier circuit useful under severe conditions.

Still a further object of the present invention is to provide an isolated DC amplifier circuit with relatively high precision without the need for any adjustment.

The present inventors attempted to use an extremely small size pulse transformer for rendering an isolated DC amplifier circuit smaller and also for reducing the cost thereof. For this purpose, a symmetrical circuit was sought so that the circuit would not be influenced by the sag and incomplete back wing of DC pulse signals transmitted through the pulse transformer; in other words, the circuit was constructed so that waveforms fed back to a DC amplifier are substantially identical to those applied to a load.

A principal operation of an isolated DC amplifier circuit of the present invention is to compare amplitudes of pulse voltages, not the average thereof, appearing in a primary winding and a secondary winding of the pulse transformer, which is driven or energized by a pulse source with driving source impedance apparently equal to zero.

DETAILED DESCRIPTION

Figure 1:
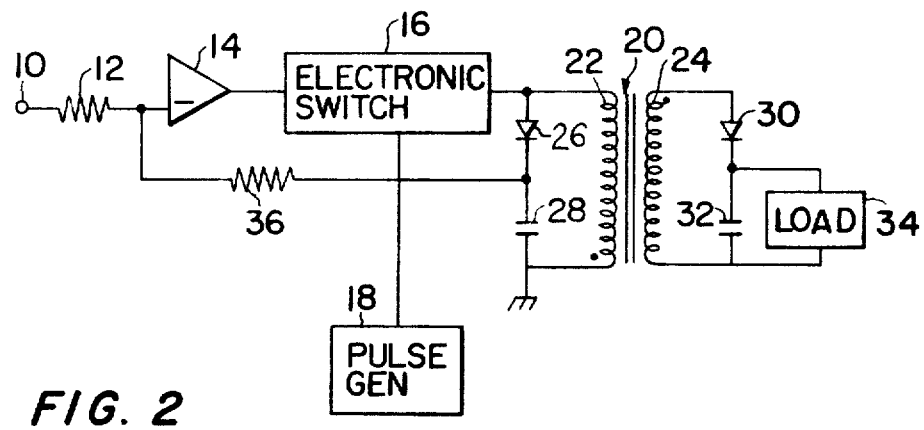
FIGS. 1 through 7 show seven separate respective embodiments of the present invention.

FIG. 1 is a basic circuit of the present invention.

DC signals are applied to DC signal input terminal 10, and then transmitted to a negative input terminal of a DC amplifier 14, for instance a differential DC amplifier made of a semiconductor integrated circuit having a small power consumption, through a input resistor 12. The amplification of the DC amplifier 14 is from $10^3$ to $10^6$.

A pulse generator 18 controls operation of an electronic switch 16, for instance, an ordinary transistor switch or a field effect transistor switch connected to the output terminal of the DC amplifier 14; in other words it periodically interrupts the operation of the electronic switch 16.

The periodically interrupted DC signals from the electronic switch 16 are applied to a primary winding 22 of a small size pulse transformer 20. DC pulse signals generated in a secondary winding 24 of the pulse transformer 20 are rectified and smoothed by a diode 30 and condenser 32 and supplied to a load 34. The DC voltages applied to the primary winding 22 are simultaneously rectified and smoothed through a diode 26 and a condenser 28 and then negatively fed back to the negative input terminal of the DC amplifier 14 through a feedback resistor 36. The polarity of the primary winding 22 and the secondary winding 24 of the pulse tranformer 20 are shown by dots in the Figure.

When positive (with respect to ground of a power source) input voltages are applied to the DC signal input terminal 10, the input voltages are then added to the inverse input terminal of the DC amplifier 14 through the input resistor 12. Negative output voltages are generated at an output terminal of the DC amplifier 14. The negative output voltages are periodically interrupted by the electronic switch 16, and a series of negative pulses is applied to the primary winding 22 of the pulse transformer 20. Induced pulse voltages in the secondary winding 24 of the pulse transformer 20 charge the condenser 32 and at the same time supply DC voltage to the load 34 across the condenser 32 after being rectified by the diode 30.

Simultaneously, the voltages appearing at the primary winding 22 of the pulse transformer 20 negatively charge the condenser 28 through the diode 26. Since the negative voltage appearing across the condenser 28 is negatively fed back to the inverse input terminal of the DC amplifier 14, the input voltage to the DC amplifier 14 eventually reaches ground potential (zero voltage) and the circuit is balanced.

The isolated output voltage $E_0$ appearing across the load 34 in this circuit is defined as follows:

$$E_0 = \frac{N_2}{N_1} \cdot \frac{R_{36}}{R_{12}} E_1$$

where $E_1$ = Input voltage, $N_1$ = Number of turns of the primary winding 22 of the pulse transformer 20.

$N_2$ = Number of turns of the secondary winding 24 of the pulse transformer 20.

$R_{12}$ = Amount of resistance of the input resistor 12.

$R_{36}$ = Amount of resistance of the feed back resistor 36.

The gain ($E_0/E_1$) of the circuit is changeable by changing the above turn ratio and/or the above resistance ratio; however, for maintaining the precision of the circuit the resistance ratio is preferably changed by setting the turn ratio at one (1).

Since the electronic switch 16 is in a closed loop in the circuit, a variation of the conductive resistance of the electronic switch 16 never causes errors in the circuit.

Figure 2:
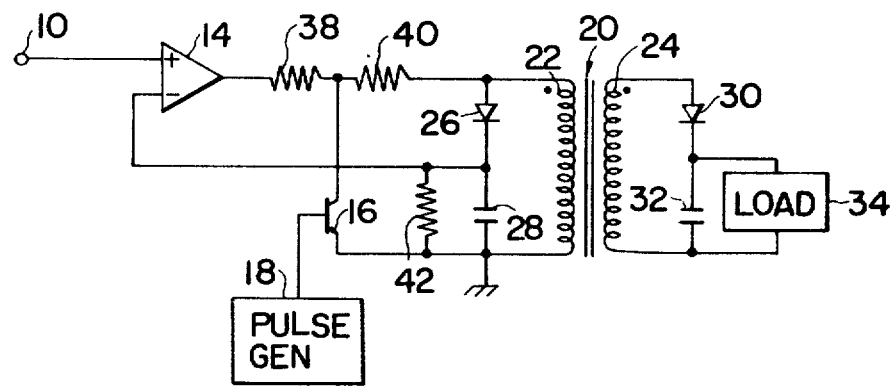

FIG. 2 shows another isolated DC amplifier circuit of the present invention. The same or equivalent parts as in the circuit of FIG. 1 are designated with the same numerals as those in FIG. 1, and the same is true for the remaining circuits shown in FIGS. 3 – 8.

Since the operating principle of the circuit shown in FIG. 2 is substantially identical to that of FIG. 1, only the essential features of this circuit will be explained.

DC signals are directly applied to a positive input terminal of the DC amplifier 14; in other words, input terminals of the DC amplifier are used differentially a higher input impedance is obtained of the circuit, which eliminates the input or operational resistor 12 and feed back resistor 36 from the circuit. The values of these resistors must be selected with an extremely high precision.

A transistor switch connected in parallel with the primary winding 22 of the pulse transformer 20 is employed as the electronic switch 16 for facilitating the driving of the switch 16, however, which necessitates driving resistor 38 and 40 connected in series; on the otherhand, the driving resistor 38 and 40 cause a relatively large loss of driving voltage. The circuit shown in FIG. 2 is not applicable to a circuit requiring a large output.

The input impedance of the circuit becomes substantially equal to that of the common mode impedance of the DC amplifier 14. The amount of the input impedance of the circuit easily reaches on the order of 1000MΩ however, in this circumstance, since the impedance of the negative or inverse input terminal of the DC amplifier, to which the feedback signals are applied, increases, and a responsive characteristic of the circuit decreases because of a large time constant for discharging the condenser 28, a discharge resistor 42 is added in parallel with the condenser 28, the amount of resistance of the resistor 42 being adjusted to correspond to the amount of resistance of the load 32, for instance within a few 10% of the load resistance.

Figure 3:
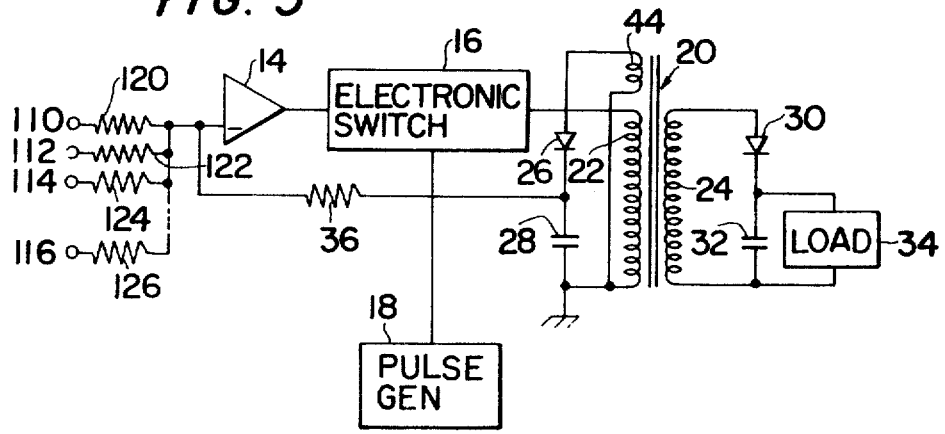

FIG. 3 shows still another isolated DC amplifier circuit with plural DC signal input terminals of the present invention.

Since plural DC signal input terminals 110, 112, 114 and 116 and corresponding operational resistors 120, 122, 124 and 126 are connected in common to the inverse input terminal of the DC amplifier 14, the circuit performs an adding operation for the plural input DC signals.

Further, the pulse transformer 20 including a feedback winding 44 in addition to the primary winding 22, and a series circuit formed by the diode 26 and the condenser 28 are connected across the feedback winding 44; as a result, an influence of the exciting current flowing through the primary winding 22 is eliminated from the feedback signals supplied to the inverse input terminal of the DC amplifier.

Figure 4:
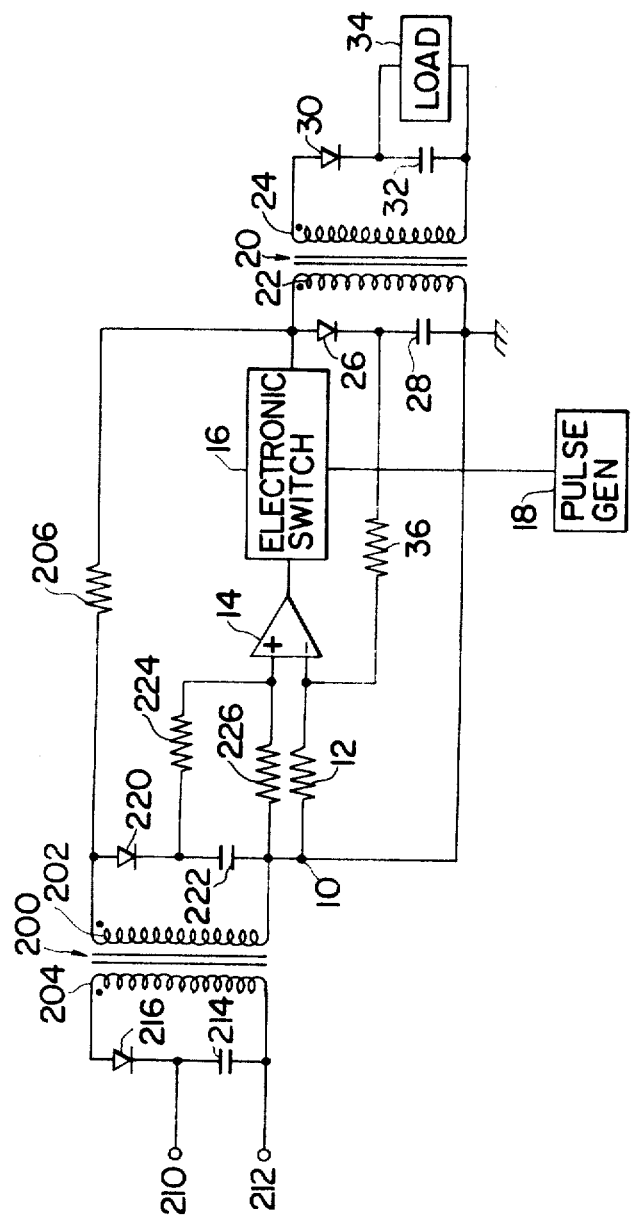

FIG. 4 shows still another isolated DC amplifier circuit of the present invention.

An input pulse transformer 200 having a primary winding 202 and a secondary winding 204 is further added on the input side of the DC amplifier 14 for further increasing the isolation property of the circuit.

Input DC signals are applied to terminals 210 and 212 so that terminal 210 is positive and the terminal 212 is negative, and charge a condenser 214 to the same voltage as the input voltage. Since diode 216 is connected inversely, discharge current hardly flows through the diode 216 and the circuit is kept in a high impedance state.

Since a slightly positive potential, for initiating operation, is applied to the positive input terminal of the DC amplifier 14 from a biasing source (not shown), a continuous DC output signal of positive polarity appears at the output terminal of the DC amplifier 14. The positive DC output signal is then applied to the primary winding 22 of the pulse transformer 20 and simultaneously to the primary winding 202 of the input pulse transformer 200 through a resistor 206, after being converted to a series of DC pulse voltages by the electronic switch 16.

Voltages appearing across both primary windings 22 and 202 are respectively rectified and smoothed through the diode 26 and condenser 28 and a diode 220 and a condenser 222, then fed back respectively to the inverse input terminal and the positive input terminal of the DC amplifier 14 through the feedback resistor 36 and a feedback resistor 224.

The charged voltage of the condenser 28 is negatively fed back to the DC amplifier 14 after being divided by the feed back resistor 36 and the operational input resistor 12, and also, the charged voltage of the condenser 222 is positively fed back to the DC amplifier 14 after being divided by the feedback resistor 224 and an operational input resistor 226.

Since the diode 216 is rendered conductive when the voltage appearing across the secondary winding 204 of the input pulse transformer slightly exceeds the charged voltage of the condenser 214, the voltage appearing across the primary winding 202 of the input pulse transformer 200 is limited to the charged voltage of the condenser 214, that is the input voltage. Consequently, the maximum charged voltage of the condenser 222 is defined by the input voltage.

When the amounts of positive and negative feedback signals respectively through the feedback resistor 36 and 224 become equal or, in other words, when the charged voltage of the condenser 222 is limited to the input voltage, the DC amplifier is balanced.

As a result, an isolated output voltage appearing across the load 34 corresponding to the isolated input voltage is obtained.

The following advantages are obtained by this particular embodiment shown in FIG. 4, 1. Since a filter circuit is provided at the input, the circuit greatly eliminates the influence of noise signals and, additionally, an extremely high input impedance is obtained.

2. When the amplitude characteristic of the primary winding 202 with respect to the secondary winding 204 of the input pulse transformer 200 is defined to be the same as that of the primary winding 22 with respect to the secondary winding 24 of the pulse transformer 20, the difference of amplitude between the both pulse transformers 200 and 20 is completely compensated and an isolated DC amplifier circuit with a higher precision is attained.

3. The breakdown voltage of the circuit is doubled and the influence of noise voltages is cut in half.

Figure 5:
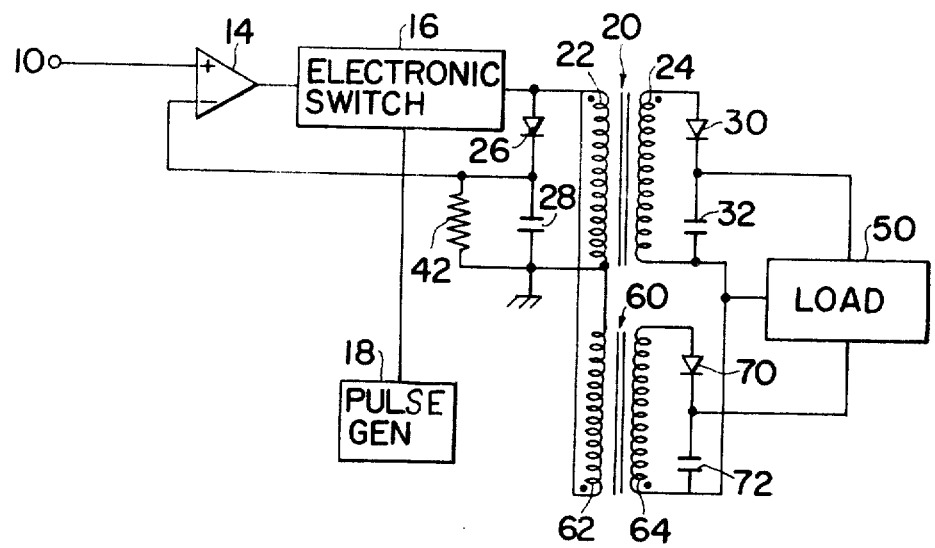

FIG. 5 shows still another isolated DC amplifier circuit of the present invention.

The circuit shown in FIG. 5 simultaneously generates symmetric output voltages having opposite polarities with respect to zero potential across a load 50. The circuit is particularly useful as a power source for a precise amplifier or as a reference voltage for a signal generator.

A second pulse transformer 60 having a primary winding 62 and a secondary winding 63 are additionally provided. The primary winding 62 of the first pulse transformer 60 is connected in parallel with the primary winding 22 of the first pulse transformer 20. A series circuit formed of a diode 70 and a condenser 72, with substantially the same characteristic as that formed of the diode 30 and the condenser 32, is connected across the secondary winding 64 of the second pulse transformer 60.

Since the preformance characteristics of the first and second transformers 20 and 60 are selected to be substantially identical and simultaneously driven or controlled by the common electronic switch 16, a positive and a negative voltage having the same absolute values are simultaneously obtained appearing over the respective condensers 32 and 72.

Figure 6:
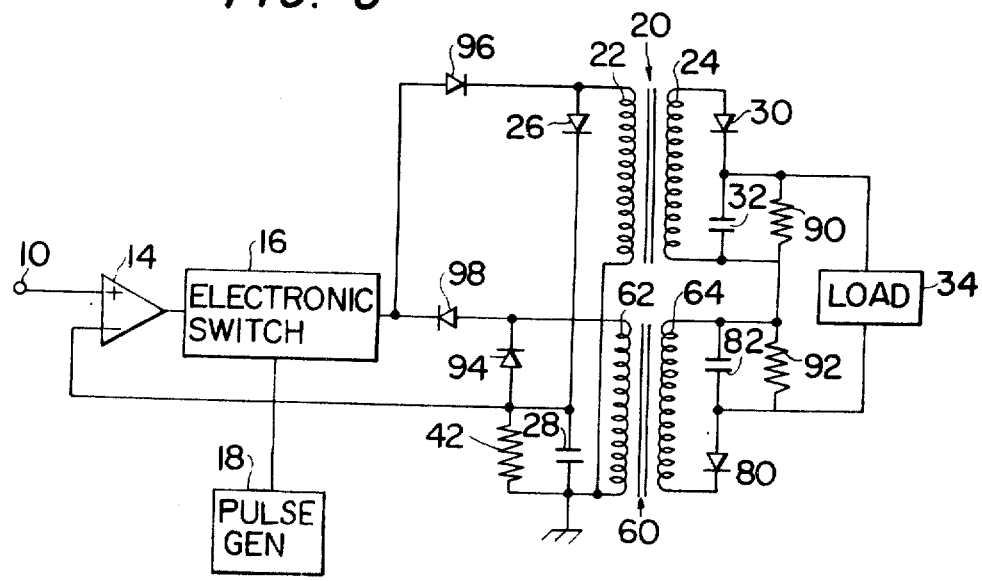

FIG. 6 shows still another isolated DC amplifier circuit of the present invention.

A series circuit of a diode 94 and common condenser 28 is connected across the primary winding 62 of the second pulse transformer 60, and a series circuit of a diode 80 and a condenser 82 is also connected across the secondary winding 64 of the second pulse transformer 60. Parallel resistors 90 and 92 are respectively connected to the condensers 32 and 92 for transmitting the output signal voltage to the load 34.

A diode 96 is connected between the output terminal of the electronic switch 16 and one terminal of the primary winding 22 of the first pulse transformer 20. A diode 98 is connected between the output terminal of the electronic switch 16 and one terminal of the primary winding 62 of the second pulse transformer 60.

The polarity of the diodes 96 and 98 is defined so as to selectively energize either the first pulse transformer 20 or the second pulse transformer 60, depending upon the polarity of the input signal voltage applied at the DC signal input terminal 10. Accordingly, the circuit generates, across the load 34, either a positive or negative output voltage corresponding to the applied input voltage through the resistor 90 and 92.

Figure 7:
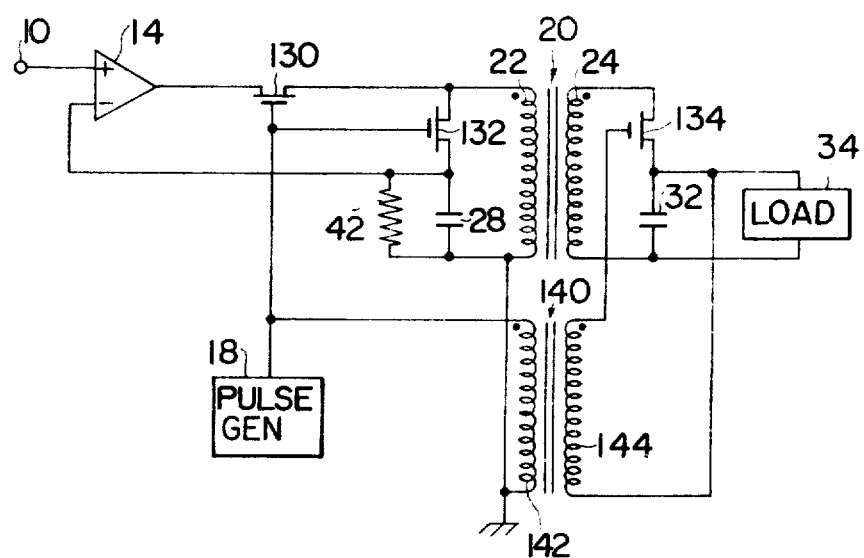

FIG. 7 shows still another isolated DC amplifier circuit of the present invention.

The circuit also generates across the load 34, either a positive or negative output voltage corresponding to the applied input voltage.

Bidirectional field effect transistors (hereinafter identified as FETs) 130, 132 and 134 are employed in the place of the electronic switch 16, the diodes 26 and 94 and the diodes 30 and 80; as a result, the second pulse transformer 60 shown in FIG. 7 is eliminated. However, a driving pulse transformer 140 having a primary winding 142 and a secondary winding 144 is added for driving the FET 134.

The gates of the FETs 130 and 132 are connected to the pulse generator 18, and one terminal of the primary winding 142 of the driving pulse transformer 140 is also connected to the pulse generator 18. One terminal of the secondary winding 144 of the driving pulse transformer 140 is connected to a gate of the FET 134. Accordingly, the FETs 130, 132, and 134, are simultaneously opened or closed, and an isolated output voltage of either positive or negative is generated across the load 34 depending upon the polarity of the applied input signal voltage.

Figure 8:
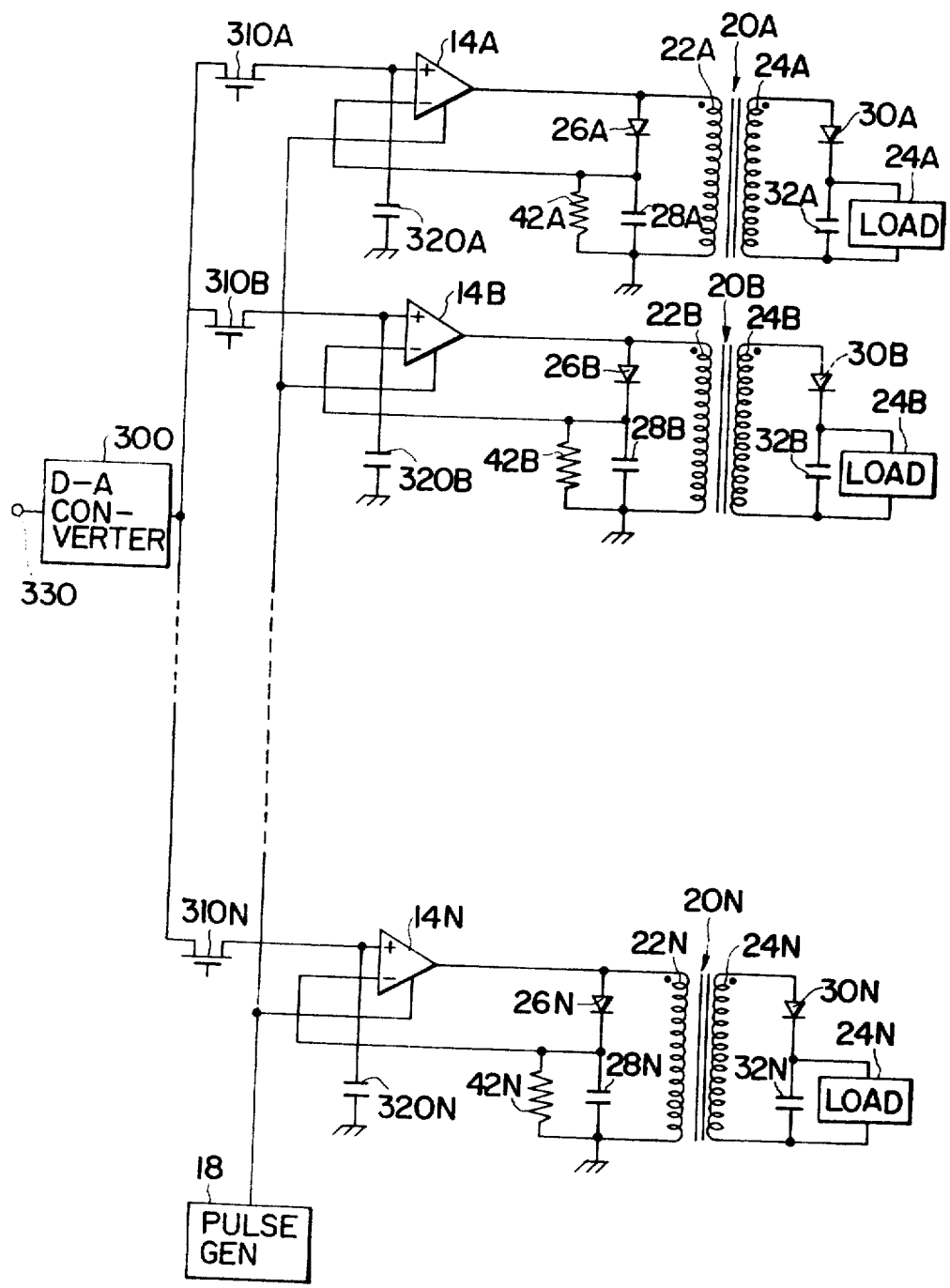
FIG. 8 shows one application circuit of the present invention to a digital to analog converter for performing a time sharing and multiplexing operation.

In FIG. 8, N identical isolated DC amplifier circuits are employed for a digital-analog converter (hereinafter identified as D-A converter) 300 through FETs 310A, 310B, - - -, and 310N for use in a multiplexer. Suffices A, B, ~ N are added after the same circuit elements with same numerals for the respective isolated DC amplifier circuits of the present invention.

Since differential comparators with a strobe are employed for respective isolated DC amplifiers 14A–14N, the electronic switch 16 shown in FIGS. 1~7 is eliminated.

Digital signals from a digital signal source, for instance, a computer, are consecutively applied to an input terminal 330 of the D-A converter, where the digital signals are converted to analog signals. Then, one of the multiplexer switches 310A, 310B, - - - and 310N of the corresponding channel, for instance 310A is closed for a short interval and the analog signals converted are stored in a corresponding memory condenser 320A. Next, for instance, the multiplexer switch 310B is closed for a short interval for storing the analog signals converted in a corresponding memory condenser 320B, depending upon signals applied to the input terminal 330. The same operation as described above is repeated for storing analog signals to respective memory condensers 320A, 320B, - - - , and 320N, in other words, respective multiplexer switches 310A, 310B, - - - and 310N are closed for a short interval by sharing the time and distributed digital signals converted to respective corresponding channels while synchronizing the operation of the D-A converter 300.

The voltage signals stored, for instance, the voltage signals stored in the memory condenser 320A, are applied to the positive input terminal of the differential comparator with the strobe 14A whose input impedance is quite high, and the differential comparator 14A generates a series of positive pulses during when strobe signals are supplied thereto from the pulse generator 18. The series of positive pulses are transmitted to the primary winding 22A of the pulse transformer 20A and the isolated DC output signal voltages are supplied to the load 34A. Simultaneously, therewith the voltages appearing in the primary winding 22A of the pulse transformer 20A charge the condenser 28A through the diode 26A. Since the voltage appearing across the condenser 28A is negatively fed back to the inverse input terminal of the differential comparator 14A, to the input voltage to the differential comparator 14A eventually reaches to ground potential and the circuit is balanced.

The operation of the other isolated DC amplifier circuits is the same as explained above.

The circuit shown in FIG. 8 is able to keep supplying analog signal voltages corresponding to respective digital voltages to plural output terminals with different potentials with respect to ground through only one D-A converter, which is very useful for multiplexing direct digital controls in computer control systems.

The driving frequency of the isolated DC amplifier circuits of the present invention reaches an order of 1MH$_z$; accordingly, the operating speed of the circuit is quite improved.

In the embodiments explained above, the signal voltages transmitted through the pulse transformer are those of the normal interval (not the fly-back interval); however, the voltages of fly-back interval may be used as signal voltages to be transmitted. This will be explained in connection with the isolated DC amplifier circuit shown in FIG. 1.

The circuit shown in FIG. 1 has to be reconstructed, so that when the electronic switch 16 is ON, the diodes 26 and 30 are OFF and when the electronic switch 16 is OFF, the diodes 26 and 30 are ON. As a result, a higher isolated output voltage than that of the DC amplifier 14 is obtained, and further, the influence of the voltage drop by the exciting current through the pulse transformer is eliminated.

While we have shown and described several embodiments in accordance with the present invention, it is understood that the same is not limited thereto but is susceptible of numerous changes and modifications as known to a person skilled in the art, and We, therefore, do not wish to be limited to the details shown and described herein but intend to cover all such changes and modifications as are obvious to one of ordinary skill in the art.

We claim:

1. An isolated DC amplifier circuit comprising:
   a DC amplifier;
   an electronic switching element connected to the output terminal of said DC amplifier;
   a pulse generator connected to said electronic switching element;
   a pulse transformer having a primary winding and a secondary winding, one terminal of the primary winding being connected to the output terminal of said electronic switching element;
   a first rectifier, one terminal of which being connected to the one terminal of the primary winding of said pulse transformer;
   a first condenser, one terminal of which is connected to the other terminal of said first rectifier, and the other terminal of said first condenser being connected to the other terminal of the primary winding of said pulse transformer;
   feedback means connected between the junction point of said first rectifier and said first condenser, and a negative input terminal of said DC amplifier;
   a second rectifier, one terminal of which is connected to one terminal of the secondary winding of said pulse transformer, the polarity of the primary winding and secondary winding of said pulse transformer being defined so that both said first and second rectifiers are simultaneously rendered conductive, when said pulse transformer is energized; and
   a second condenser one of which terminal being connected to the other terminal of said second rectifier, and the other terminal of said second condenser being connected to the other terminal of the secondary winding of said pulse transformer.

2. An isolated DC amplifier circuit defined in claim 1, further comprising a resistor connected across said first condenser, the amount of resistance of said resistor being adjusted substantially equivalent to a load connected across said second condenser.

3. An isolated DC amplifier circuit defined in claim 1, further comprising:
   an input pulse transformer having a primary winding and a secondary winding, one terminal of the primary winding of said input pulse transformer being connected to a positive input terminal of said DC amplifier through a first resistor;
   a first diode connected to the other terminal of the primary winding of said input pulse transformer;
   a third condenser connected to the other terminal of said first diode and the other terminal of said third condenser being connected to the one terminal of the primary winding of said input pulse transformer;
   a second resistor connected between the junction point of said first diode and said third consenser and the positive input terminal of said DC amplifier;
   a third resistor connected between the other terminal of the primary winding of said input pulse transformer and the one terminal of said first rectifier;
   a second diode connected to one terminal of the secondary winding of said input pulse transformer; and
   a fourth condenser, one terminal of which is connected to the other terminal of said second diode and the other terminal of said fourth condenser being connected to the other terminal of the secondary winding of said input pulse transformer.

4. An isolated DC amplifier circuit comprising:
   a DC amplifier;
   an electronic switching element connected to the output terminal of said DC amplifier;
   a pulse generator connected to said electronic switching element;
   a first and a second pulse transformer, each having a primary winding and a second winding, both primary windings of said first and second pulse transformers being connected in parallel and one terminal of the primary winding of said first pulse transformer being connected to the output terminal of said electronic switching element;
   a first rectifier, one terminal of which is connected to the one terminal of the primary winding of said first pulse transformer;
   a first condenser, one terminal of which is connected to the other terminal of said first rectifier, and the other terminal of said first condenser being connected to the other terminal of the primary winding of said first pulse transformer;
   feedback means connected between the junction point of said first rectifier and said first condenser, and a negative input terminal of said DC amplifier;
   a second rectifier, one terminal of which is connected to one terminal of the secondary winding of said first pulse transformer;
   a second condenser, one terminal of which is connected to the other terminal of said second rectifier and the other terminal of said second condenser being connected to the other terminal of the secondary winding of said first pulse transformer;

a third rectifier, one terminal of which is connected to one terminal of the secondary winding of said second pulse transformer;

the polarity of the respective primary windings and secondary windings of said first and second pulse transformers being defined so that said first, second and third rectifiers are simultaneously rendered conductive when said first and second pulse transformers are energized;

a third condenser, one terminal of which is connected to the other terminal of said third rectifier and the other terminal of said third condenser being connected to the other terminal of the secondary winding of said second pulse transformer; and a resistor connected across said first condenser, the amount of resistance of said resistor being adjusted substantially equivalent to respective loads connected across said second and third condenser.

5. An isolated DC amplifier circuit comprising:

a DC amplifier;

an electronic switching element connected to the output terminal of said DC amplifier;

a pulse generator connected to said electronic switching element;

a first and a second pulse transformer, each having a primary winding and secondary winding, one terminal of the primary winding of said first pulse transformer being connected to the output terminal of said electronic switching element through a first diode, one terminal of the primary winding of said second pulse transformer being also connected to the output terminal of said electronic switching element through a second diode, and the other terminals of the respective primary windings of said first and second pulse transformers being connected in common, either said first pulse transformer or said second pulse transformer being energized depending upon the polarities of DC signals applied to an input terminal of said DC amplifier;

a first rectifier connected to the one terminal of the primary winding of said first pulse transformer;

a second rectifier connected to the one terminal of the primary winding of said second pulse transformer, the other terminals of said first and second rectifiers being connected in common;

a first condenser one terminal of which is connected to the other terminal of said first rectifier and the other terminal of said first condenser being connected to the other terminal of the primary winding of said first pulse transformer;

feedback means connected between the junction point of said first rectifier and said first condenser and a negative input terminal of said DC amplifier;

a third rectifier connected to one terminal of the secondary winding of said first pulse transformer;

a fourth rectifier connected to one terminal of the secondary winding of said second pulse transformer, the other terminals of the respective secondary windings of said first and second pulse transformers being connected in common;

a second condenser, one terminal of which is connected to the other terminal of said third rectifier and the other terminal of said second condenser being connected to the other terminal of the secondary winding of said first pulse transformer; and a third condenser, one terminal of which is connected to the other terminal of said fourth rectifier and the other terminal of said third condenser being connected to the other terminal of the secondary winding of said second pulse transformer.

6. An isolated DC amplifier circuit comprising:

a DC amplifier;

a first bidirectional switching element connected to the output terminal of said DC amplifier;

a pulse generator connected to a gate of said first bidirectional switching element;

a pulse transformer having a primary winding and secondary winding, one terminal of the primary winding of said pulse transformer being connected to the output terminal of said first bidirectional switching element;

a second bidirectional switching element connected to the one terminal of the primary winding of said pulse transformer, a gate of said second bidirectional switching element being connected to said pulse generator;

a first condenser one terminal of which being connected to the other terminal of said second bidirectional switching element and the other terminal of said first condenser being connected to the other terminal of the primary winding of said pulse transformer;

feedback means connected between the junction point of said second bidirectional switching element and said first condenser and a negative input terminal of said DC amplifier;

a driving pulse transformer having a primary winding and a secondary winding, one terminal of the primary winding of said driving pulse transformer being connected to said pulse generator;

a third bidirectional switching element one of which terminal being connected to one terminal of the secondary winding of said pulse transformer, a gate of said third bidirectional switching element being connected to one terminal of the secondary winding of said driving pulse transformer;

a second condenser, one terminal of which is connected to the other terminal of said third bidirectional switching element, and the other terminal of said second condenser being connected to the other terminal of the secondary winding of said pulse transformer; and a resistor connected across said first condenser, the amount of resistance of said resistor being adjusted substantially equivalent to a load connected across said second condenser.

* * * * *